United States Patent [19]
Ohta

[11] Patent Number: 5,184,324
[45] Date of Patent: Feb. 2, 1993

[54] DYNAMIC SEMICONDUCTOR MULTI-VALUE MEMORY DEVICE

[75] Inventor: Yoshiji Ohta, Yamatokoriyama, Japan

[73] Assignee: Sharp Kabushiki Kaisha, Japan

[21] Appl. No.: 727,233

[22] Filed: Jul. 5, 1991

[30] Foreign Application Priority Data

Dec. 20, 1990 [JP] Japan .................................. 2-403964

[51] Int. Cl.$^5$ ............................................... G11C 5/10
[52] U.S. Cl. ...................................... 365/149; 365/203
[58] Field of Search ......................... 365/149, 203, 205

[56] References Cited

U.S. PATENT DOCUMENTS

| | | | |
|---|---|---|---|
| 4,103,342 | 7/1978 | Miersch et al. | 365/149 |
| 4,858,193 | 8/1989 | Furutani et al. | 365/203 |
| 4,872,142 | 10/1989 | Hannai | 365/149 X |
| 4,947,377 | 8/1990 | Hannai | 365/205 X |
| 5,010,523 | 4/1991 | Yamauchi | 365/205 |
| 5,010,524 | 4/1991 | Firfield et al. | 365/205 |
| 5,012,447 | 4/1991 | Matsuda et al. | 365/149 X |
| 5,062,079 | 10/1991 | Tsuchida et al. | 365/149 X |
| 5,111,434 | 5/1992 | Cho | 365/203 X |

OTHER PUBLICATIONS

A. Tanabe et al., Autumn National Convention of Electronic Information Communication Society, "Boost Sense Amplifier for Low Voltage Operation DRAM" 1990, p. 5-256.

Y. Ohta et al., Sharp Gihoh, vol. 44, pp. 47-50, Mar. 1990, "A Novel Memory Cell Architecture for High--Density DRAMS" with partial English Translation.

Primary Examiner—Eugene R. LaRoche
Assistant Examiner—Do Hyun Yoo
Attorney, Agent, or Firm—Nixon & Vanderhye

[57] ABSTRACT

A dynamic semiconductor multi-value memory device has memory cells each of which includes a series circuit of one storage capacitor and two transistors. A first capacitor is connected between a first bit line of a first bit line pair and a second bit line of a second bit line pair which is adjacent to the first bit line pair. A second capacitor is connected between a second bit line of the first bit line pair and a first bit line of the second bit line pair.

4 Claims, 7 Drawing Sheets

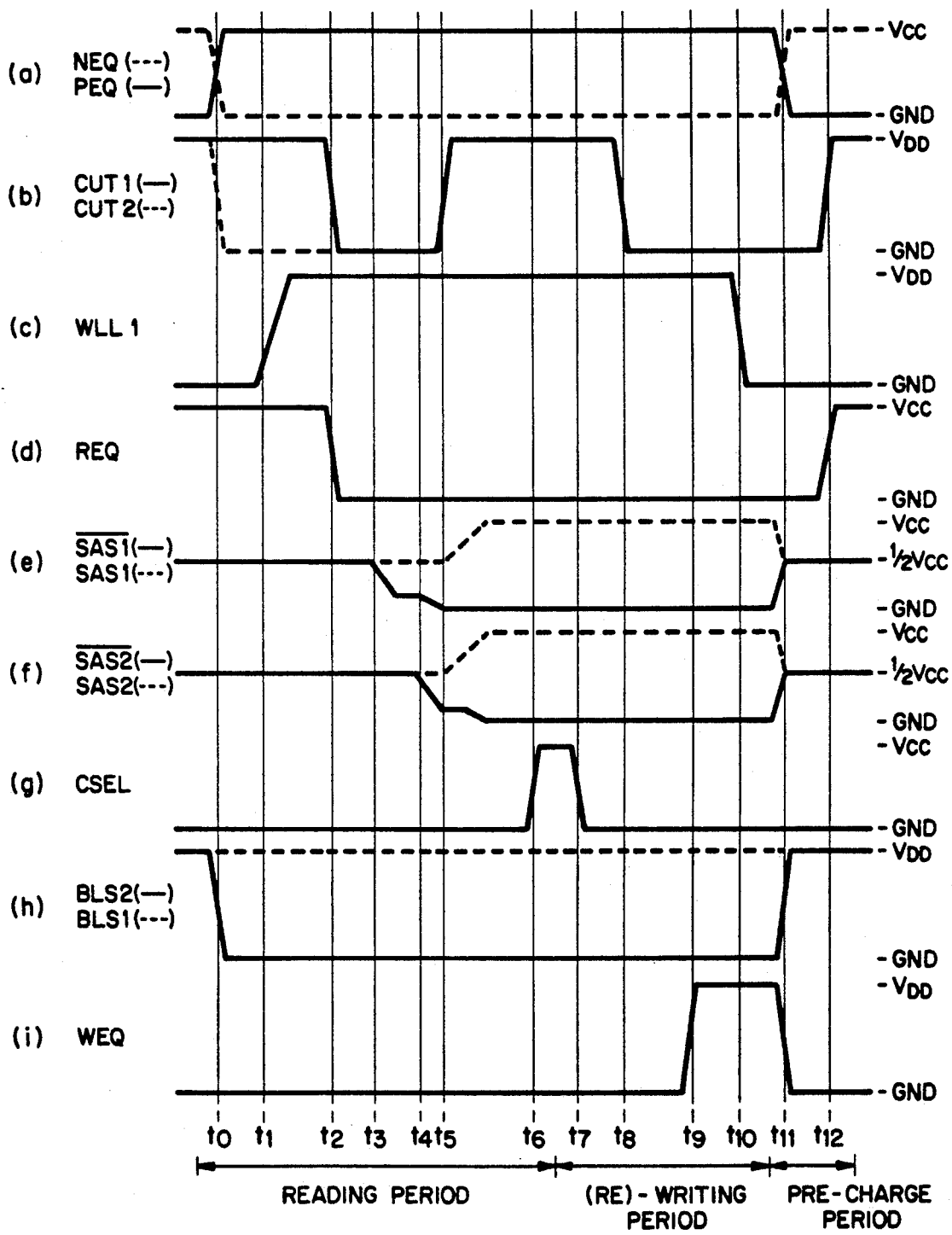

DYNAMIC SEMICONDUCTOR MULTI-VALUE MEMORY DEVICE

BACKGROUND OF THE INVENTION

1. Field of the Invention

The present invention relates to a dynamic semiconductor memory device, and more particularly to a dynamic semiconductor multi-value memory device which can rapidly operate.

2. Description of the Prior Knowledge

While the operation speed of a dynamic semiconductor memory device has been remarkably improved, a dynamic semiconductor multi-value memory device remains to operate slower than a two-value dynamic semiconductor memory device, and has a less read-out margin.

FIGS. 5A and 5B illustrate a dynamic semiconductor multi-value memory device which is disclosed in co-pending U.S. patent application Ser. No. 455,989 commonly assigned and filed on Dec. 22, 1989 and now abandoned. The multi-value memory device of FIGS. 5A and 5B comprises a plurality of four-level memory cells 10, and two sense amplifiers 16 and 17. Each of the four-level memory cells 10 consists of a storage capacitor 11, and two transfer gates 12 and 13. The sense amplifiers 16 and 17 are constructed in the same manner as a sense amplifier used in a conventional two-value memory device.

In this memory device, when the sense amplifiers 16 and 17 are operated to sense the data stored in the four-level memory cells 10, the reference level is determined by capacitors provided in a read-out circuit 28. This requires that during the operation of the sense amplifiers 16 and 17 the capacitors must be charged in response to signals UP1 and UP2, resulting in a problem in that the commencement of the operation of the sense amplifiers 16 and 17 is delayed by the rising period of the signals UPI and UP2.

Furthermore, in the multi-value memory device of FIGS. 5A and 5B, transistors are used to select the capacitors to be charged in the read-out circuit 28. Therefore, the read-out margin of the memory device is restricted by the variation in the threshold value of the transistors in the read-out circuit 28.

SUMMARY OF THE INVENTION

The dynamic semiconductor memory device of this invention, which overcomes the above-discussed and numerous other disadvantages and deficiencies of the prior art, comprises: memory cells each for storing multi-value data; and a plurality of bit line pairs of first and second bit lines, said first and second bit lines being complementary to each other, and further comprises: first capacitor means connected between the first bit line of one of said bit line pairs and the second bit line of another one of said bit line pairs, said other one bit line pair being adjacent to said one bit line pair; and second capacitor means connected between the second bit line of said one bit line pair and the first bit line of said other one bit line pair.

Preferably, each of said multi-value memory cells comprises: a storage capacitor; first selection means connected between one terminal of said storage capacitor and the first bit line of the respective one of said bit line pairs; and second selection means connected between the other terminal of said storage capacitor and the second bit line of said respective one bit line pair.

Preferably, said memory device further comprises disconnection means provided in said first and second bit lines of each of said bit line pairs, said disconnection means being able to electrically separate said first and second capacitor means from the memory cells connected to the corresponding one of said bit line pairs.

Preferably, said memory device further comprises first and second switching means, said first switching means being able to connect the first bit line of said one bit line pair and the first bit line of said other one bit line pair, said second switching means being able to connect the second bit line of said one bit line pair and the second bit line of said other one bit line pair.

Thus, the invention described herein makes possible the objectives of:

(1) providing a dynamic semiconductor multi-value memory device which can rapidly operate;

(2) providing a dynamic semiconductor multi-value memory device in which the read-out margin is not affected by the variation in the threshold value of transistors;

(3) providing a dynamic semiconductor multi-value memory device in which no transistor is required in the selection of the capacitor to be charged in the read-out circuit; and (4) providing a dynamic semiconductor multi-value memory device in which no signal is required to charge the capacitors in the read-out circuit.

BRIEF DESCRIPTION OF THE DRAWINGS

This invention may be better understood and its numerous objects and advantages will become apparent to those skilled in the art by reference to the accompanying drawings as follows:

FIG. 2 is a timing chart illustrating the operation of the memory device of FIGS. 1A and 1B.

DESCRIPTION OF THE PREFERRED EMBODIMENTS

Figure 1A:
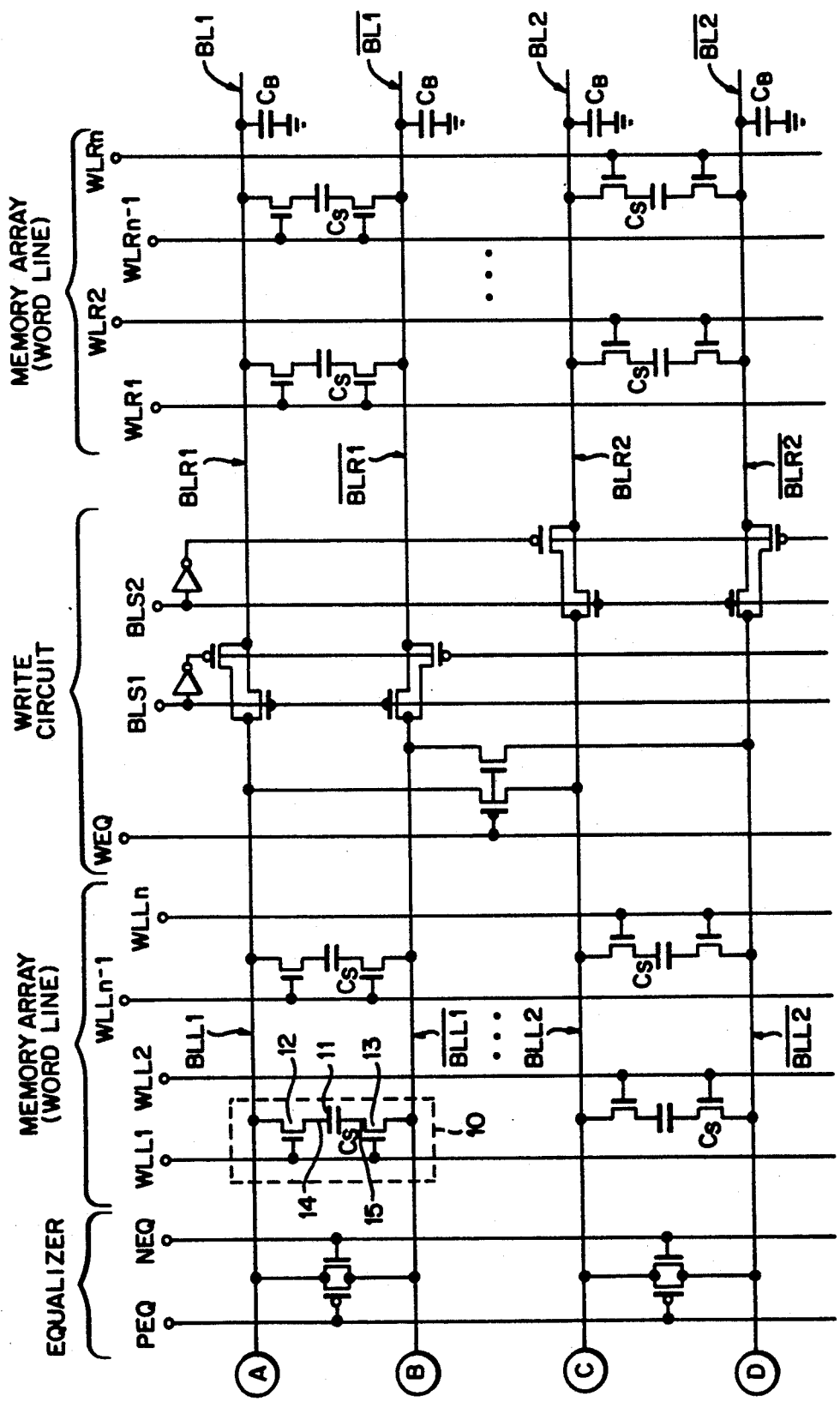
FIGS. 1A and 1B are circuit diagrams illustrating a dynamic semiconductor memory device according to the invention.
Figure 1B:
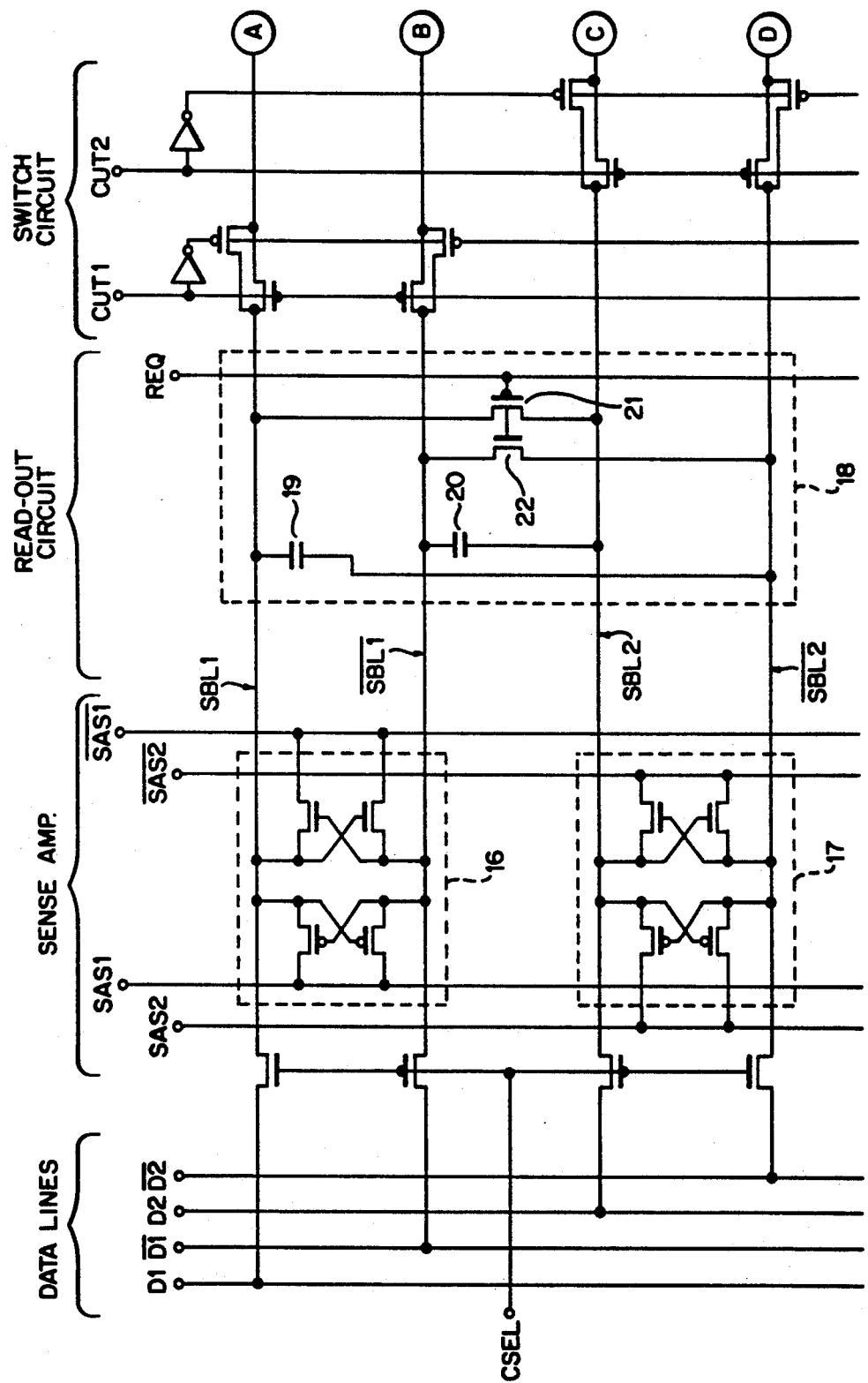
Figure 5A:
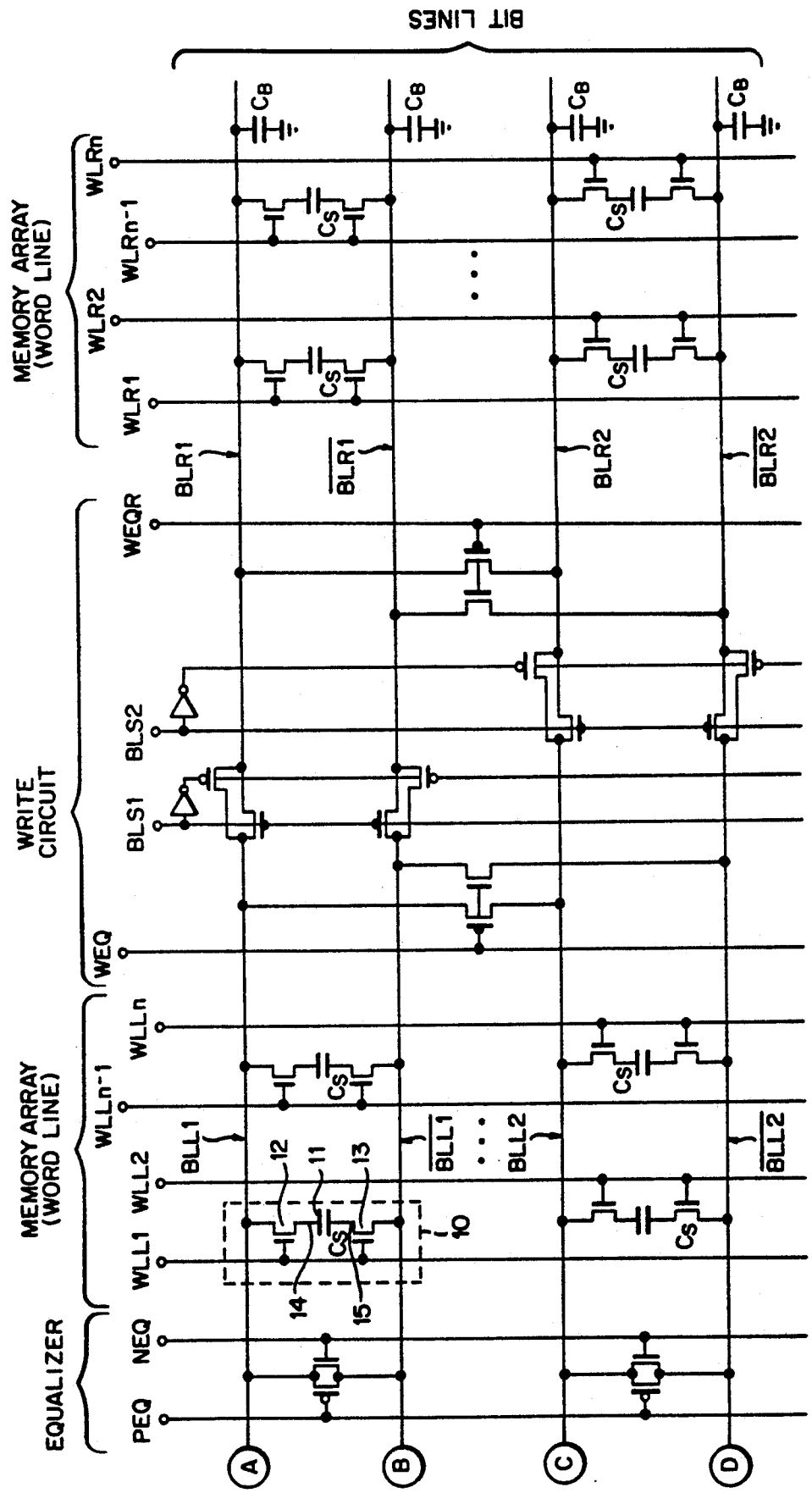
FIGS. 5A and 5B are circuit diagrams illustrating a dynamic semiconductor memory device disclosed in an earlier U.S. patent application.
Figure 5B:
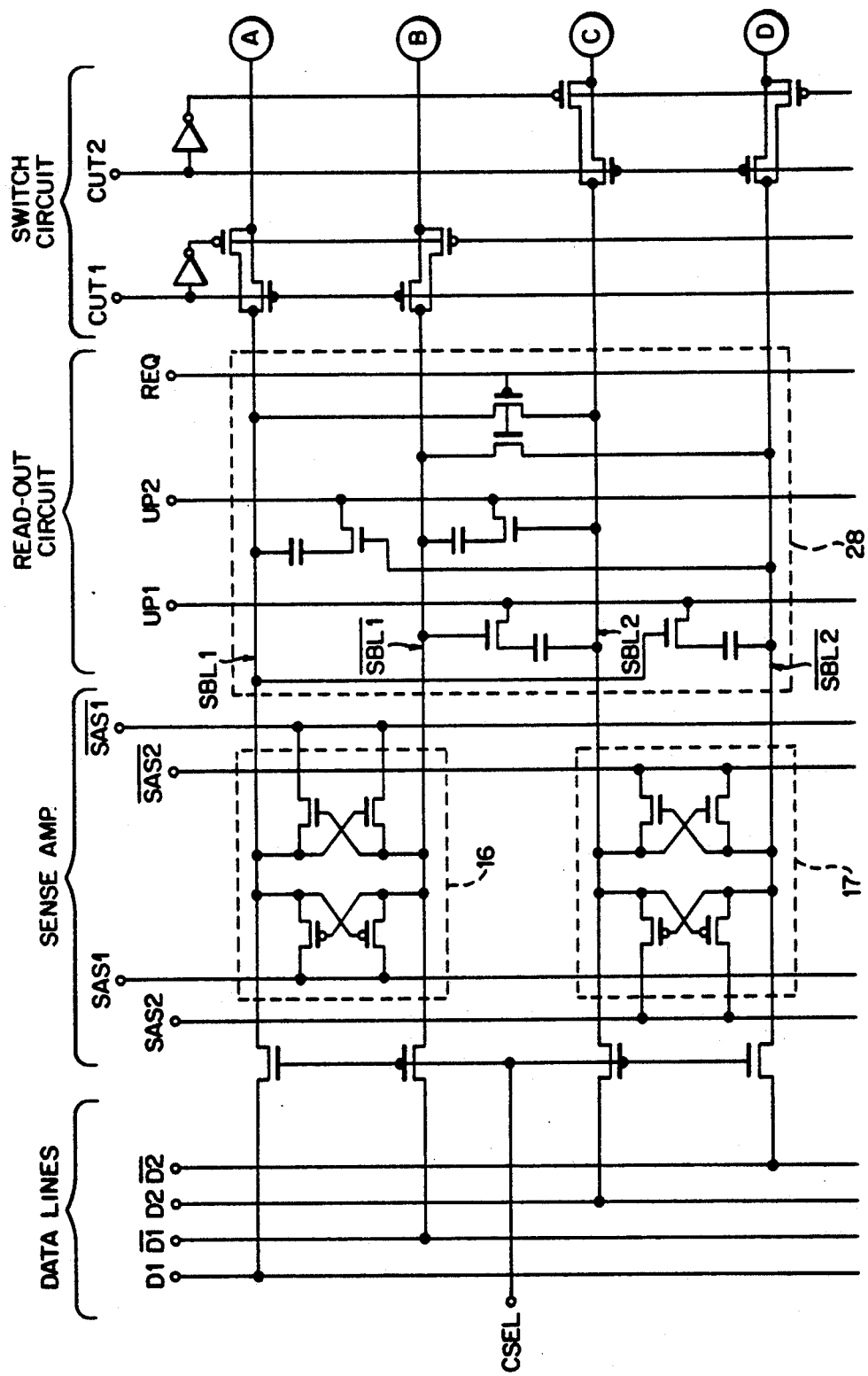

FIGS. 1A and 1B illustrate a dynamic semiconductor multi-value memory device according to the invention. The memory device has a plurality of four-level memory cells 10, two sense amplifiers 16 and 17, and two pairs of bit lines $\overline{BL1}$ and BL1 and BL2 and $\overline{BL2}$. Each of the bit lines are sectioned into three portions as shown in FIGS. 1A and 1B (e.g., the bit line BL1 is sectioned into portions BLR1, BLL1 and SBL1). In the description, for the sake of simplicity, these bit line portions are also referred to as "the bit lines". Each of the four-level memory cells 10 includes a storage capacitor 11, and two transfer gates 12 and 13. The memory cells 10, and sense amplifiers 16 and 17 are constructed in the same manner as those shown in FIGS. 5A and 5B.

The read-out circuit 18 in this embodiment comprises a capacitor 19 connected between the bit lines SBL1 and $\overline{SBL2}$, a capacitor 20 connected between the bit lines $\overline{SBL1}$ and SBL2, an NMOS transistor 21 connected between the bit lines SBL1 and SBL2, and an NMOS transistor 22 connected between the bit lines $\overline{SBL1}$ and $\overline{SBL2}$. The gates of the transistors 21 and 22 are connected to the read equalize line REQ.

The read, re-write, precharge and write operations of the memory cell 10 selected and designated by a word line WLL1 and complementary bit lines BL1 and $\overline{BL1}$ will be described with reference to FIG. 2.

(1) Read operation

When data are to be read out from the memory cell 10, an NMOS equalizing signal NEQ (broken line) and PMOS equalizing signal PEQ (solid line) are respectively lowered and raised at time $t_0$ as shown in (a) of FIG. 2. Therefore, transistors provided in the bit line equalizer circuit and connected to the bit lines BLL1 and $\overline{BLL1}$ are turned off, so that the precharge operation of the bit lines BLL1 and $\overline{BLL1}$ is completed, and the voltage levels of the both bit lines are set to Vcc/2.

Subsequently, the memory cell 10 connected to the bit lines BLL1 and $\overline{BLL1}$ is selected, and transistors provided in the bit line-sense amplifier cutoff circuit and connected to the line CUT2 and those provided in the writing circuit and connected to the bit line select line BLS2 are turned off ((b) and (h) of FIG. 2). At time $t_1$, the level of the word line WLL1 is raised ((c) of FIG. 2). Then, the charges stored in the storage capacitor 11 of the memory cell 10 are transferred to the bit lines BLL1, BLR1, SBL1 and SBL2 through the first transfer gate 12, and to the bit lines $\overline{BLL1}$, $\overline{BLR1}$, $\overline{SBL1}$ and $\overline{SBL2}$ through the second transfer gate 13.

When the level of the line CUT1 is lowered at time $t_2$ ((b) of FIG. 2), the bit lines BLL1 and $\overline{BLL1}$ are electrically separated from the sense amplifiers 16 and 17. At the same time, the read equalize line REQ is lowered ((d) of FIG. 2), so that the bit lines SBL1 and SBL2 which have been connected to each other through the transistor 21 are separated from each other, and that the bit lines $\overline{SBL1}$ and $\overline{SBL2}$ which have been connected to each other through the transistor 22 are separated from each other. This causes the sense amplifiers 16 and 17 to individually have the same data which has been transferred from the memory cell 10.

At time $t_3$, the sense amplifier signal $\overline{SAS1}$ is lowered ((e) of FIG. 2), and the sense amplifier 16 begins to operate. The level of the bit line SBL1 or $\overline{SBL1}$ whichever is lower falls. This result is transferred to the bit line $\overline{SBL2}$ or SBL2 through the capacitor 19 or 20.

The sense amplifier signal $\overline{SAS2}$ is lowered at time $t_4$ ((f) of FIG. 2), and the levels of both the lines CUT1 and CUT2 are raised at time $t_5$ ((b) of FIG. 2) to respectively connect the sense amplifiers 16 and 17 with the bit lines BLL1 and $\overline{BLL1}$ and BLL2 and $\overline{BLL2}$. In response to the sense amplifier signals SAS1 and SAS2, the sense amplifiers 16 and 17 perform the pull-up operation.

Finally, the column select signal CSEL is raised at time $t_6$ ((g) of FIG. 2) to transfer the amplified data signals from the sense amplifiers 16 and 17 to the data line pairs D1 and $\overline{D1}$ and D2 and $\overline{D2}$, thereby completing the read operation.

The variations of the potential levels of the bit line pairs SBL1 and $\overline{SBL1}$ and SBL2 and $\overline{SBL2}$ in the vicinity of time $t_3$ will be described. A memory cell in the embodiment stores two-bit data in the storage capacitor. Therefore, there are four cases of voltage levels of the storage nodes 14 and 15 when the memory cell 10 stores data, as shown in Table 1. In Table 1, the "Data" column indicates data signals output to the data lines D1 and D2, and "H" and "L" respectively correspond to the potential of the power source (Vcc) and the ground level (GND).

TABLE 1

| Data | D1 = H<br>D2 = H | D1 = H<br>D2 = L | D1 = L<br>D2 = H | D1 = L<br>D2 = L |
|---|---|---|---|---|
| Node 14 | Vcc | 2Vcc/3 | Vcc/3 | GND |
| Node 15 | GND | Vcc/3 | 2Vcc/3 | Vcc |

Figure 3:
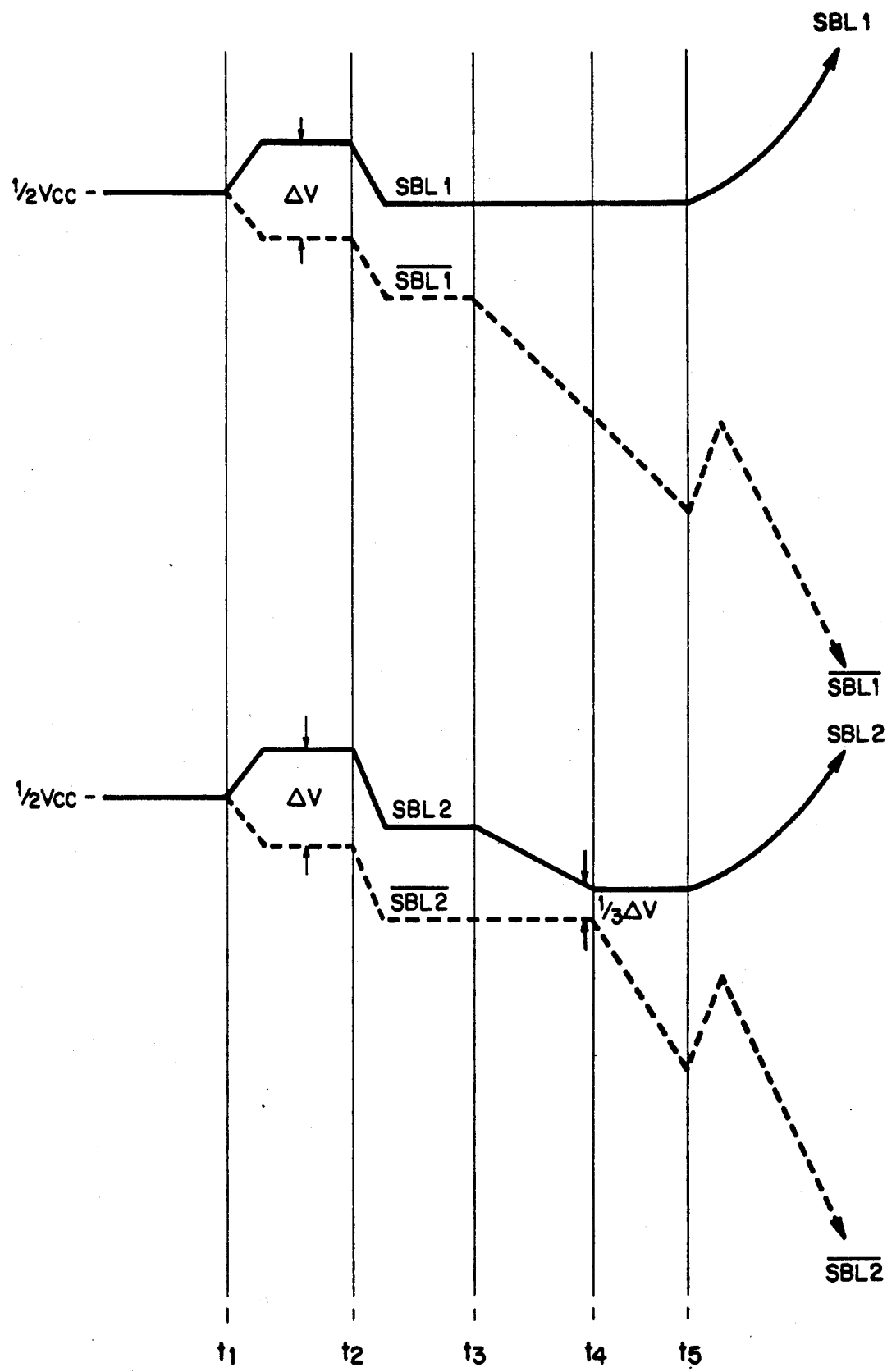
FIGS. 3 and 4 show simulated potential variations of the bit lines in the memory device of FIGS. 1A and 1B.
Figure 4:
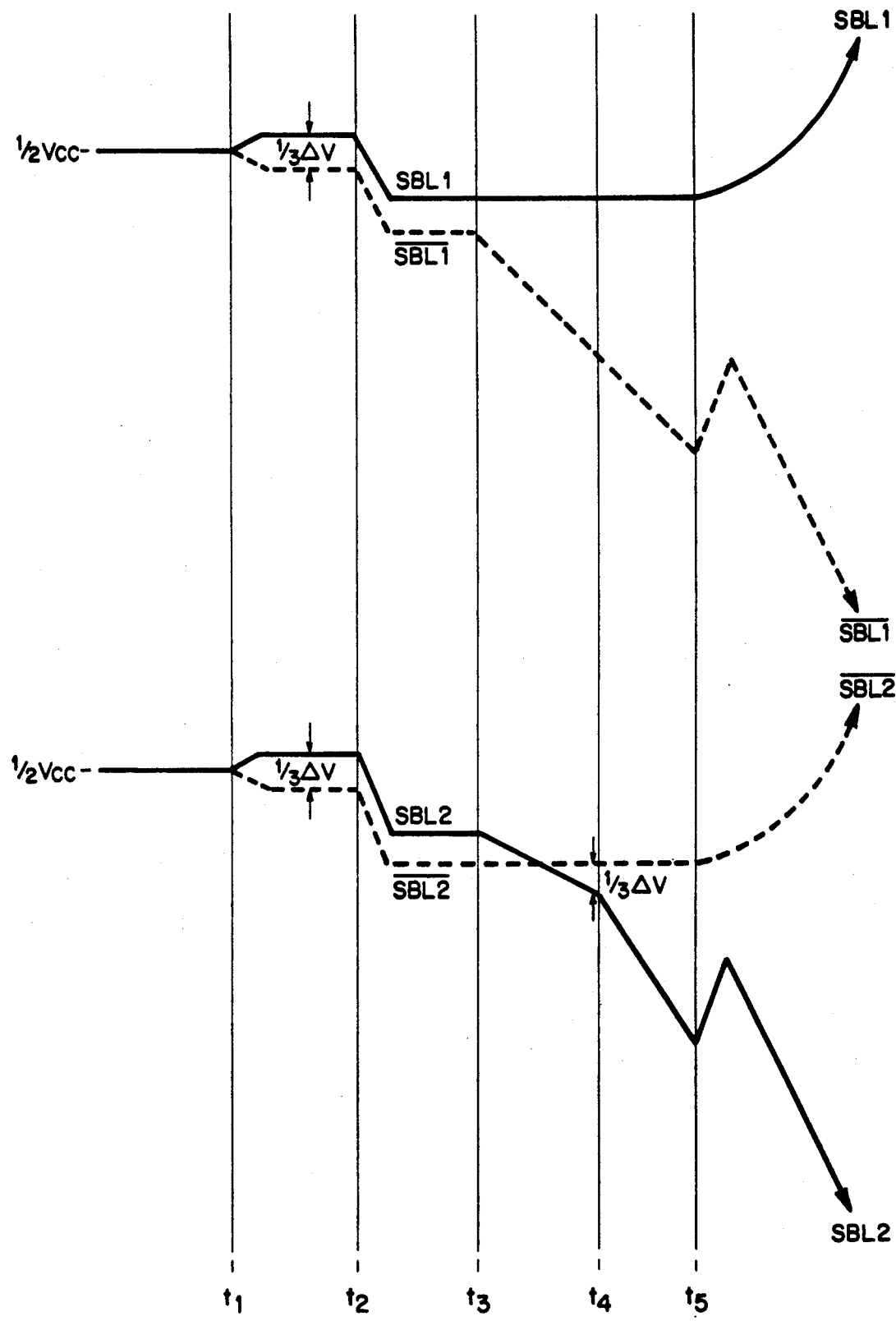

FIG. 3 shows the potential variations of the bit lines SBL1, $\overline{SBL1}$, SBL2 and $\overline{SBL2}$ appearing when the data of (D1=H, D2=H) is read out, and FIG. 4 those appearing when the data of (D1=H, D2=L) is read out. The potential variations in the case of reading out the data of (D1=L, D2=L) becomes equivalent to those of FIG. 3 when replacing the bit line SBL1 with the bit line $\overline{SBL1}$, and the bit line SBL2 with the bit line $\overline{SBL2}$. Similarly, the potential variations in the case of reading out the data of (D1=L, D2=H) becomes equivalent to those of FIG. 4 when replacing the bit line SBL1 with the bit line $\overline{SBL1}$, and the bit line SBL2 with the bit line $\overline{SBL2}$. Therefore, the following description deals only with the first two cases (i.e., the cases of reading the data of (D1=H, D2=H) and (D1=H, D2=L)).

In the case of reading out the data of (D1=H, D2=H), the potential difference between the nodes 14 and 15 is Vcc. When the potential of the word line WLL1 is raised at time $t_1$, there are generated potential differences ($\Delta V$) between the respective pairs of complementary bit lines SBL1 and $\overline{SBL1}$, and SBL2 and $\overline{SBL2}$, as shown in FIG. 3. The potential difference $\Delta V$ is represented by the following expression:

$$\Delta V = \frac{2 \cdot C_S}{C_B + 2 \cdot C_S} \cdot Vcc$$

where $C_S$ is the capacitance of the storage capacitor 11, and $C_B$ is the parasitic capacitance of one bit line. At time $t_3$, the sense amplifier signal $\overline{SAS1}$ is lowered, and the sense amplifier 16 begins to operate, whereby the level of the bit line $\overline{SBL1}$ is lowered. This causes the bit line SBL2 which is capacitively coupled to the bit line $\overline{SBL1}$ through the capacitor 20, to be lowered by $2\Delta V/3$. The capacitance of the capacitor 20 is previously selected so as to cause this potential decrease of $2\Delta V/3$. The potential of the bit line SBL2 remains higher by $\Delta V/3$ than that of the bit line $\overline{SBL2}$ as shown in FIG. 3, so that, after the sense operation which begins at time $t_4$, the Vcc level appears on both the data lines D1 and D2.

By contrast, in the case of reading out the data of (D1=H, D2=L), the potential difference between the nodes 14 and 15 is Vcc/3. When the potential of the word line WLL1 is raised at time $t_1$, therefore, there are generated potential differences ($\Delta V/3$) between the respective pairs of the complementary bit lines SBL1 and $\overline{SBL1}$, and SBL2 and $\overline{SBL2}$, as shown in FIG. 4. At time $t_3$, the sense amplifier signal $\overline{SAS1}$ is lowered, and the sense amplifier 16 begins to operate, whereby the level of the bit line $\overline{SBL1}$ is lowered. This causes potential of the bit line SBL2 to be lowered by $2\Delta V/3$. As a result, the potential of the bit line SBL2 becomes lower than that of the bit line $\overline{SBL2}$ by $\Delta V/3$ as shown in FIG. 4. After the sense operation which begins at time $t_4$, therefore, the Vcc level appears on the data line D1, and the ground level appears on the data line D2.

(2) Re-write operation

As shown in FIG. 2, the level of the column select signal CSEL is lowered at time $t_7$ to disconnect the data lines D1-$\overline{D2}$ from the sense amplifiers 16 and 17, and then the potentials of the lines CUT1 and CUT2 are lowered at time $t_8$ to disconnect the read-out circuit 18 from the bit lines BLL1-$\overline{BLL2}$. Thereafter, the write equalizing signal WEQ is raised at time $t_9$ ((i) of FIG. 2), so that the bit line BLL2 is connected to the bit lines BLL1 and BLR1 and the bit line $\overline{BLL2}$ connected to the bit lines $\overline{BLL1}$ and $\overline{BLR1}$.

Consequently, the potentials of the bit lines are varied to have the values as summarized in Table 2. Each of the nodes 14 and 15 begins to have potential equal to that which appeared at the respective node before the rise of the word line WLL1, and electric charges the amounts of which correspond to the potential difference between the bit lines BLL1 and $\overline{BLL1}$ are stored in the storage capacitor 11.

TABLE 2

| | Data | D1 = H D2 = H | D1 = H D2 = L | D1 = L D2 = H | D1 = L D2 = L |
|---|---|---|---|---|---|
| Before $t_9$ | BLL1 BLR1 Node 14 | Vcc | Vcc | GND | GND |
| | BLL2 | Vcc | GND | Vcc | GND |
| | $\overline{BLL1}$ $\overline{BLR1}$ Node 15 | GND | GND | Vcc | Vcc |
| | $\overline{BLL2}$ | GND | Vcc | GND | Vcc |
| After $t_9$ | BLL1 BLR1 BLL2 Node 14 | Vcc | 2Vcc/3 | Vcc/3 | GND |
| | $\overline{BLL1}$ $\overline{BLR1}$ $\overline{BLL2}$ Node 15 | GND | Vcc/3 | 2Vcc/3 | Vcc |

Then, the potential of the word line WLL1 is lowered at time $t_{10}$ to complete the re-write operation.

(3) Precharge operation

In the precharge operation, the levels of the bit line select line BLS2 and equalizing signals WEQ, NEQ and PEQ are returned to the initial states, at time $t_{11}$. The potentials of the bit lines BLL1-$\overline{BLL2}$ and BLR1-$\overline{BLR2}$ are made equal to a half of the power source voltage Vcc (Vcc/2) by charge division, and also levels of the sense amplifier signals SAS1, $\overline{SAS1}$, SAS2 and $\overline{SAS2}$ are returned to Vcc/2 so that the operation of the sense amplifiers is stopped.

Then, the potentials of the lines CUT1, CUT2 and REQ are raised at time $t_{12}$, thereby completing the precharge operation.

(4) Write operation

In the read operation, the data lines D1-$\overline{D2}$ are in a floating condition until the level of the column selection signal CSEL is raised at time $t_6$ as shown in FIG. 2. By contrast, in the write operation for writing data in a memory cell, the potentials of the data lines D1-$\overline{D2}$ are fixed to High (Vcc) or Low (GND) depending upon the data to be written, and after the rise of the column selection signal CSEL (time $t_6$) the potentials of the bit lines are set to the potentials of the data lines D1-$\overline{D2}$ which correspond to the data to be written.

After time $t_6$, the same procedures as those in the re-write operation are performed to store the data to be written in the memory cell 10.

According to the invention, no transistor is required in the selection of the capacitor to be charged in the read-out circuit, and no signal is required to charge the capacitors in the read-out circuit. Therefore, in a semiconductor memory device according to the invention, the sense operation can be performed rapidly, and the read-out margin is not affected by the variation in the threshold value of transistors. These greatly contribute to the improvement of the operating speed of a dynamic semiconductor memory device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a dynamic semiconductor memory device comprising: memory cells each for storing multi-value data; and a plurality of bit line pairs of first and second bit lines, said first and second bit lines being complementary to each other, said memory device further comprises:

first capacitor means connected between the first bit line of one of said bit line pairs and the second bit line of another one of said bit line pairs, said other one bit line pair being adjacent to said one bit line pair; and second capacitor means connected between the second bit line of said one bit line pair and the first bit line of said other one bit line pair.

2. A dynamic semiconductor memory device according to claim 1, wherein each of said multi-value memory cells comprises: a storage capacitor; first selection means connected between one terminal of said storage capacitor and the first bit line of the one of said bit line pairs; and second selection means connected between the other terminal of said storage capacitor and the second bit line of said one bit line pair.

3. A dynamic semiconductor memory device according to claim 1, wherein said memory device further comprises disconnection means provided in said first and second bit lines of each of said bit line pairs, said disconnection means being able to electrically separate said first and second capacitor means from the memory cells connected to the corresponding one of said bit line pairs.

4. A dynamic semiconductor memory device according to claim 1, wherein said memory device further comprises first and second switching means, said first switching means being able to connect the first bit line of said one bit line pair and the first bit line of said other one bit line pair, said second switching means being able to connect the second bit line of said one bit line pair and the second bit line of said other one bit line pair.

* * * * *